(12) United States Patent
Chung et al.

(10) Patent No.: US 7,968,971 B2
(45) Date of Patent: Jun. 28, 2011

(54) THIN-BODY BIPOLAR DEVICE

(75) Inventors: Shine Chung, San Jose, CA (US);
Fu-Lung Hsueh, Cranbury, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 136 days.

(21) Appl. No.: 12/500,915

(22) Filed: Jul. 10, 2009

(65) Prior Publication Data
US 2010/0320572 A1 Dec. 23, 2010

Related U.S. Application Data

(60) Provisional application No. 61/219,316, filed on Jun. 22, 2009.

(51) Int. Cl.
*H01L 21/02* (2006.01)
(52) U.S. Cl. .................. 257/586; 257/E29.182
(58) Field of Classification Search .............. 257/586, 257/E29.182
See application file for complete search history.

(56) References Cited

U.S. PATENT DOCUMENTS

| | | | |
|---|---|---|---|
| 6,706,571 B1 | 3/2004 | Yu | |
| 6,858,478 B2 | 2/2005 | Chau | |
| 6,949,768 B1 | 9/2005 | Anderson et al. | 257/74 |
| 7,056,781 B2 | 6/2006 | Yoon | |
| 7,190,050 B2 | 3/2007 | King | |
| 7,247,887 B2 | 7/2007 | King | |
| 7,265,008 B2 | 9/2007 | King | |
| 7,508,031 B2 | 3/2009 | Liu | |
| 7,528,465 B2 | 5/2009 | King | |
| 7,605,449 B2 | 10/2009 | Liu | |
| 2006/0197185 A1 | 9/2006 | Chung | 257/552 |
| 2007/0105301 A1 | 5/2007 | Chen et al. | 438/234 |
| 2008/0003757 A1* | 1/2008 | Cheng et al. | 438/309 |
| 2009/0045467 A1* | 2/2009 | Kakoschke et al. | 257/370 |
| 2009/0309167 A1* | 12/2009 | Russ et al. | 257/370 |
| 2010/0187656 A1* | 7/2010 | Ke et al. | 257/586 |
| 2010/0207161 A1* | 8/2010 | Shrivastava et al. | 257/133 |

OTHER PUBLICATIONS

Chang, Leland et al., "Extremely Sealed Silicon Nano-CMOS Devices" Processing of the IEEE, vol. 91, No. 11, Nov. 2003, pp. 1860-1873.
Huang, Xuejue et al., "Sub 50-nm FinFET: PMOS", Dept. of Electrical Engineering and Computer Sciences, Univ. Of CA at Berkeley; IEEE (1999).
U.S. Appl. No. 12/410,428, filed Mar. 24, 2009, Tsu-Jae King.
U.S. Appl. No. 11/755,715, filed May 30, 2007, Victor Moroz.
U.S. Appl. No. 12/178,496, filed Jul. 23, 2008, Tsu-Jae King.
U.S. Appl. No. 11/668,827, filed Jan. 30, 2007, Tsu-Jae King Liu.
U.S. Appl. No. 11/668,815, filed Jan. 30, 2007, Tsu-Jae King Liu.

* cited by examiner

*Primary Examiner* — Trung Dang
(74) *Attorney, Agent, or Firm* — K&L Gates LLP

(57) ABSTRACT

A thin-body bipolar device includes: a semiconductor substrate, a semiconductor fin constructed over the semiconductor substrate, a first region of the semiconductor fin having a first conductivity type, the first region serving as a base of the thin-body bipolar device, and a second and third region of the semiconductor fin having a second conductivity type opposite to the first conductivity type, the second and third region being both juxtaposed with and separated by the first region, the second and third region serving as an emitter and collector of the thin-body bipolar device, respectively.

16 Claims, 4 Drawing Sheets

THIN-BODY BIPOLAR DEVICE

PRIORITY INFORMATION

This application claims the benefits of U.S. Provisional Patent Application Ser. No. 61/219,316, which was filed on Jun. 22, 2009, and entitled "Thin-Body Bipolar Device."

BACKGROUND

The present invention relates generally to integrated circuit (IC) designs, and more particularly to bipolar devices with a thin-body structure. This concept of this patent application can be referred to merged MOS/bipolar device in US patent publication No. 2006/0197185 and No. 2007/0105301.

Although complementary metal-oxide-semiconductor (CMOS) devices have advantages of low power consumption and high input impedance, they often need some specially designed I/O devices and circuits to protect them from high voltage signals. Those I/O devices and circuits usually require extra masks in the course of semiconductor processing. One way to simplify the semiconductor processing is to use bipolar devices as the I/O devices. The bipolar devices are able to sustain relatively high voltage. In addition, bipolar devices have many advantages over CMOS devices in designing analog circuitry. However, the conventional bipolar device is very complicated to manufacture. Though parasitic lateral bipolar devices can be formed through standard CMOS process, their performance is generally inferior to those formed by genuine bipolar processes. It would be desirable to design high performance bipolar devices in CMOS compatible process to achieve better performance.

FIG. 1 illustrates a conventional PNP bipolar transistor 10 compatible with CMOS process technologies. The LOCal Oxidation of Silicon (LOCOS) isolations 11 define three active areas 12, 13 and 14 on N well 15 in a semiconductor substrate. The active areas 12 and 13 doped with P-type impurities form an emitter 16 and a collector 17, respectively. The LOCOS isolation 11 between the emitter 16 and collector 17 defines an intrinsic base 18 thereunder in the Nwell 15. An extrinsic base 19 is electrically connected to the intrinsic base 18 via the body of the Nwell 15. The extrinsic base 19 is doped with N-type impurities to improve its conductivity. When the emitter 16, collector 17 and extrinsic base 19 are properly biased, carriers would flow between the emitter 16 and the collector 17 to produce amplification of currents.

The design of the conventional PNP bipolar transistor 10 is not suitable for ICs using three-dimensional CMOS devices. As the size of electronic devices in ICs continues to scale down, the IC design and manufacturing face new challenges. For example, failure caused by punch-though between the source and the drain of a CMOS device becomes a serious reliability issue to CMOS devices with a scale under 45 nm. As a result, many new designs have been proposed to improve the reliability of CMOS devices scaled under 45 nm. One of the proposed designs is the Fin Field Effect Transistor (FinFET) characterized by its fin-shaped source and drain, and a surrounding gate structure. The width of the fin-shaped source and drain can be controlled to eliminate the punch-through often occurred between the source and the drain of a conventional CMOS device.

As such, what is desired is a FinFET-like bipolar device that can be formed by regular CMOS process.

SUMMARY

The present invention discloses a thin-body bipolar device. In one embodiment of the present invention, the thin-body bipolar device includes: a semiconductor substrate, a semiconductor fin constructed over the semiconductor substrate, a first region of the semiconductor fin having a first conductivity type, the first region serving as a base of the thin-body bipolar device, and a second and third region of the semiconductor fin having a second conductivity type opposite to the first conductivity type, the second and third region being both juxtaposed with and separated by the first region, the second and third region serving as an emitter and collector of the thin-body bipolar device, respectively. The base region may be defined by a poly-silicon gate structure. Additionally, the thin-body bipolar device may be formed on an insulation layer over the substrate. Connections to the base can be made either to the top of the base region or through the substrate.

The construction and method of operation of the invention, however, together with additional objectives and advantages thereof will be best understood from the following description of specific embodiments when read in connection with the accompanying drawings.

DESCRIPTION

This invention describes a thin-body bipolar device constructed based on a FinFET structure. The following merely illustrates various embodiments of the present invention for purposes of explaining the principles thereof. It is understood that those skilled in the art will be able to devise various equivalents that, although not explicitly described herein, embody the principles of this invention.

Figure 1:
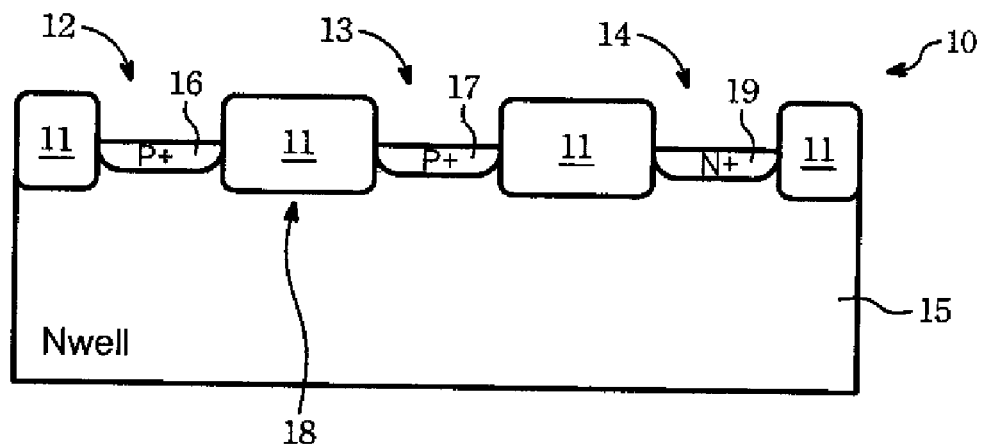
FIG. 1 illustrates a cross-sectional view of a conventional bipolar device.
Figure 2:
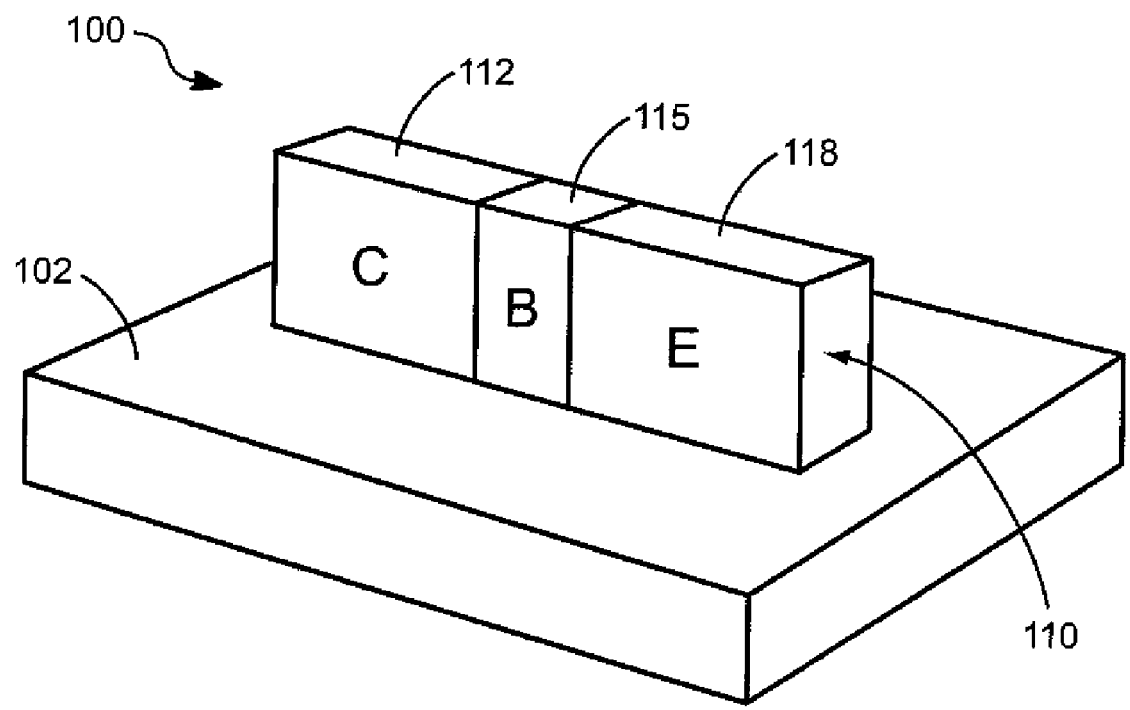
FIG. 2 illustrates a three-dimensional view of a thin-body bipolar device in accordance with one embodiment of the present invention.

FIG. 2 illustrates a three-dimensional view of a thin-body bipolar device 100 in accordance with one embodiment of the present invention. Unlike the conventional bipolar device 10 of FIG. 1 which is formed inside the substrate 15, the thin-body bipolar device 100 is formed in a thin fin 110 elevated above the substrate 102. The thin fin 110, typically made of a semiconductor material such as Silicon, is doped into three regions 112, 115 and 118. When the thin-body bipolar device 100 is a PNP type, both the region 112 and 118 are doped with P-type impurities, forming an emitter and a collector of the bipolar device 100, respectively, while the region 115 is doped with N conductivity type, or simply N-type, impurities, forming a base of the bipolar device 100. When the thin-body bipolar device 100 is a NPN type, both the region 112 and 118 are doped with N conductivity type impurities, forming an emitter and a collector of the bipolar device 100, respectively, while the region 115 is doped with P conductivity type, or simply P-type impurities, forming a base of the bipolar device 100. The thin-body bipolar device 100 can be formed similarly to FinFETs by a conventional CMOS process. Since the thin-body bipolar device 100 is formed above the substrate 102 which only provides connections in certain cases described hereinafter, the substrate 102 can be made of any semiconductor materials such as silicon (Si), germanium (Ge), gallium phosphide (GaP), indium arsenide (InAs), indium phosphide (InP), silicon germanium (SiGe), galkium arsenide (GaAs), etc. That is to say the thin-body bipolar device 100 of the present invention can be incorporated into many kinds of semiconductor processes.

Figure 3:
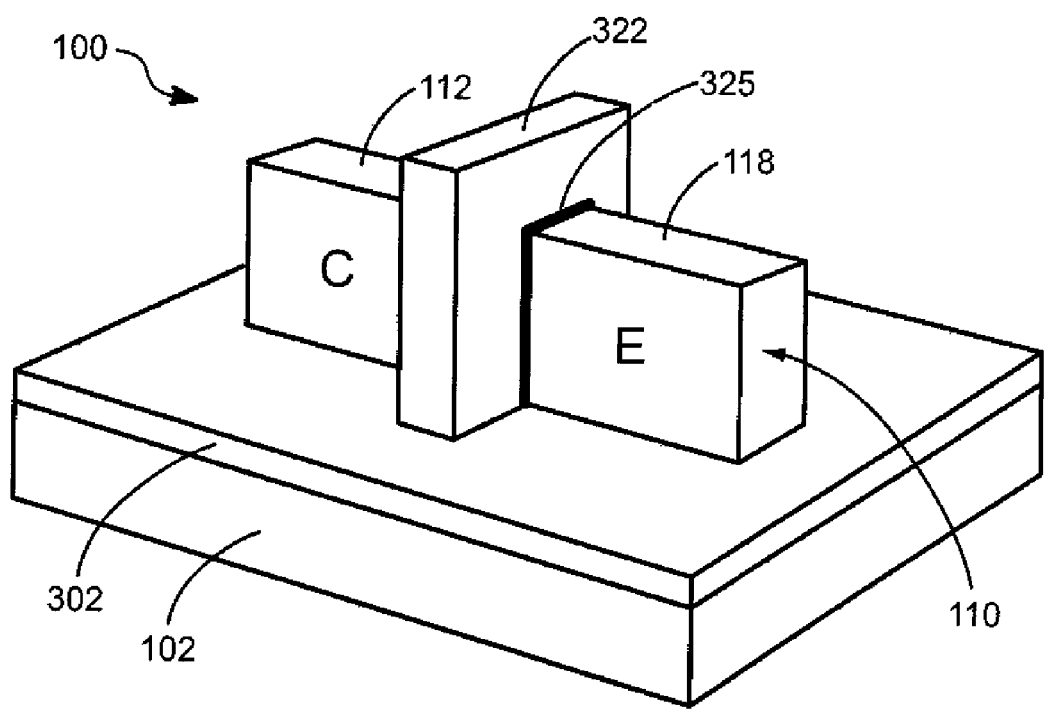
FIG. 3 illustrates a three-dimensional view of the thin-body bipolar device formed similarly to a FinFET in accordance with the embodiment of the present invention.

FIG. 3 illustrates a three-dimensional view of the thin-body bipolar device 100 formed similarly to a FinFET in accordance with the embodiment of the present invention. The thin fin 110, in this case, is formed above an insulation layer 302 which is formed on top of the substrate 102. In order to form a PNP thin-body bipolar device, an N-type impurity is first implanted in the entire thin fin 110. Then a poly-silicon double gate 322 is deposited over a portion of the thin fin 110 that defines the base region of the thin-body bipolar device 100. A P-type impurity is then implanted in the thin fin 110. The region covered by the double gate 322 remains as an N-type, but the exposed regions 112 and 118 becomes P-type. In this way, a PNP thin-body bipolar device is formed in the thin fin 110 with regions 112 and 118 becomes collector and emitter, respectively. In a similar fashion, a NPN thin-body bipolar device can also be formed in the thin fin 110. As in FinFET, there is a thin gate oxide layer 325 between the poly-silicon double gate 322 and the thin fin 110. The thin gate oxide layer 325 also function as spacers to separate the poly-silicon double gate 322 and the collector region 112 and the emitter 118. The poly-silicon double gate 322 can be stripped off after the formation of the thin-body bipolar device 100, left floating or applied a controllable voltage for addition control of the base of the thin-body bipolar device 100. In order to improve conductivity, self-aligned silicide (salicide) layers can be formed on the collector region 112 and the emitter region 118.

Figure 4:
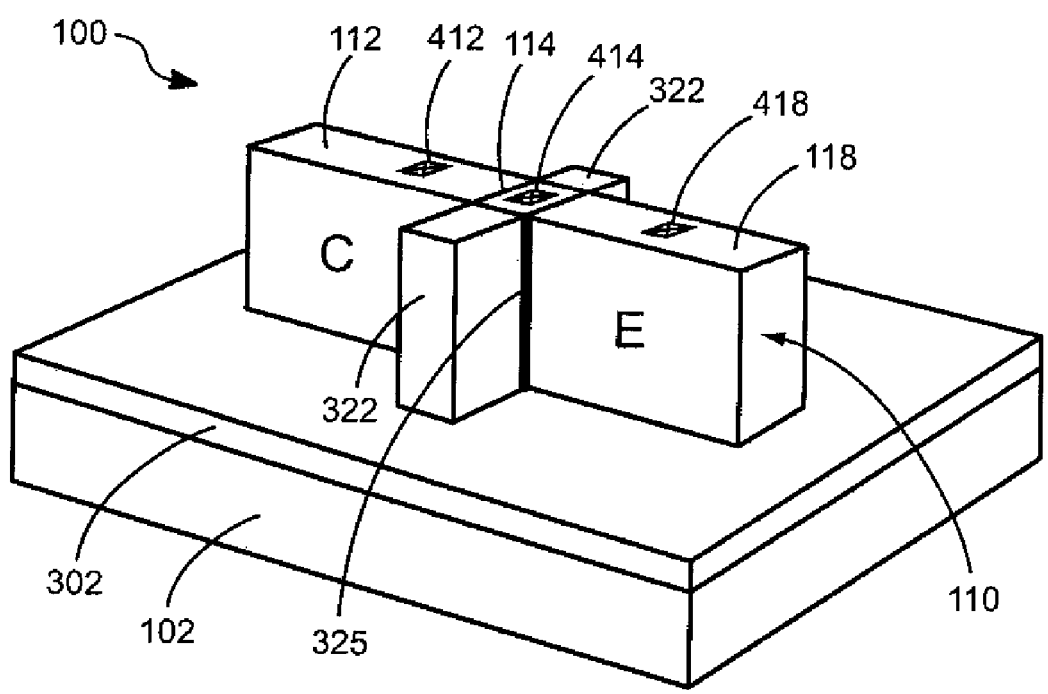
FIG. 4 illustrates a three-dimensional view of the thin-body bipolar device with contacts made to the top of the thin fin.

FIG. 4 illustrates a three-dimensional view of the thin-body bipolar device 100 with contacts made to the top of the thin fin 110. After forming the thin-body bipolar device 100 as shown in FIG. 3, the top portion of the poly-silicon double gate 322, so that the top of the base region 114 of the thin fin 110 is exposed. Then a contact 414 is made to the base region 114. At the same time, a contact 412 is made to the collector region 112, and a contact 418 is made to the emitter region 118.

Figure 5:
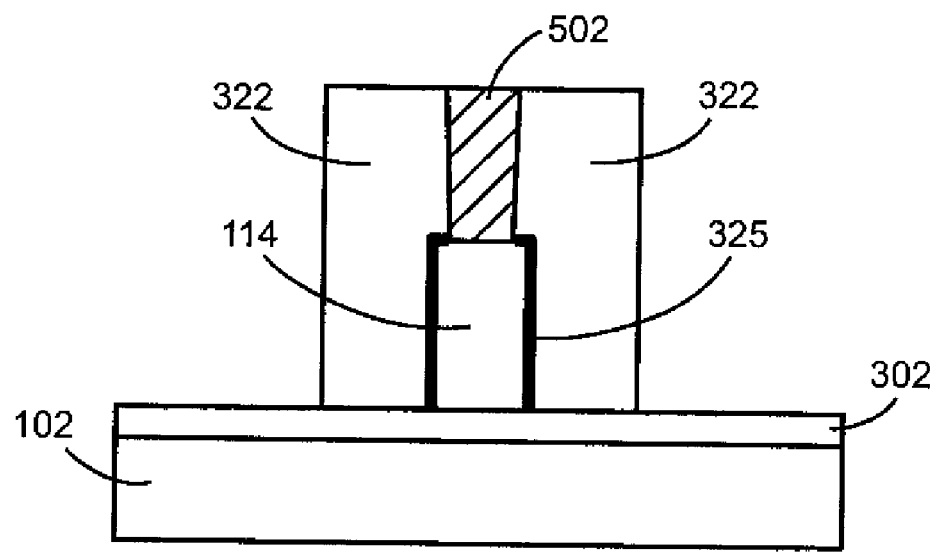
FIG. 5 is a cross-sectional view of the thin-body bipolar device at the base region illustrating an alternative way of making the base contact on the top of the thin fin.

FIG. 5 is a cross-sectional view of the thin-body bipolar device 100 at the base region 114 illustrating an alternative way of making the base contact on the top of the thin fin. Instead of removing the poly-silicon material across the board, a contact opening 502 is etched through the poly-silicon double gate 322 reaching the base region 114. Then conventional metal materials are filled in the contact opening 502 to form the base contact.

Figure 6:
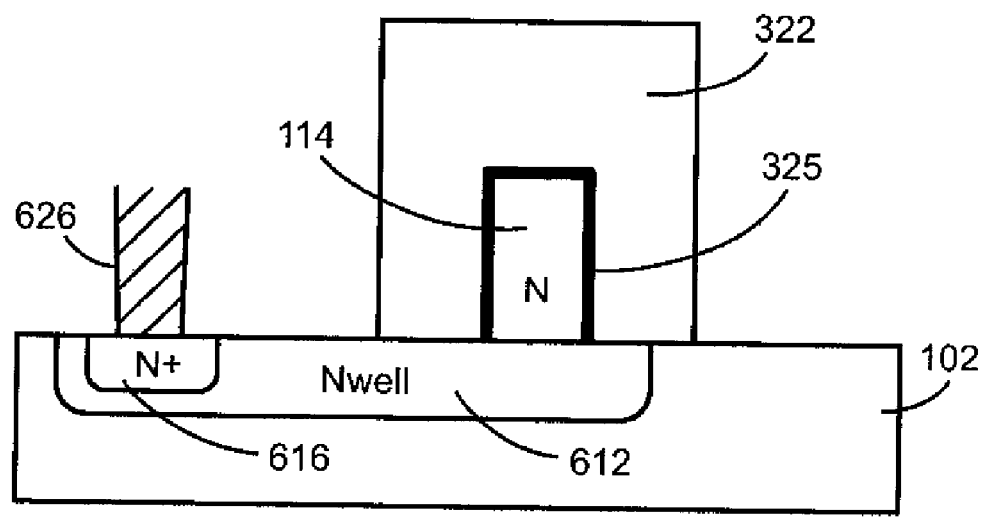
FIG. 6 is a cross-sectional view of the thin-body bipolar device at the base region illustrating a base contact made through the substrate.

FIG. 6 is a cross-sectional view of the thin-body bipolar device 100 at the base region 114 illustrating a base contact made through the substrate 102. An Nwell 612 is formed in the substrate 102 before the N-type base region 114 of the thin fin 110 (referring to FIG. 2) is formed on top of the Nwell 612. Then an N+ implant region 616 is made in the Nwell 612 for landing a subsequent contact 626. The connection to the base region 114 comprises, therefore, the contact 626, the N+ region 616 and the Nwell 612 which touches the base region 114.

Figure 7:
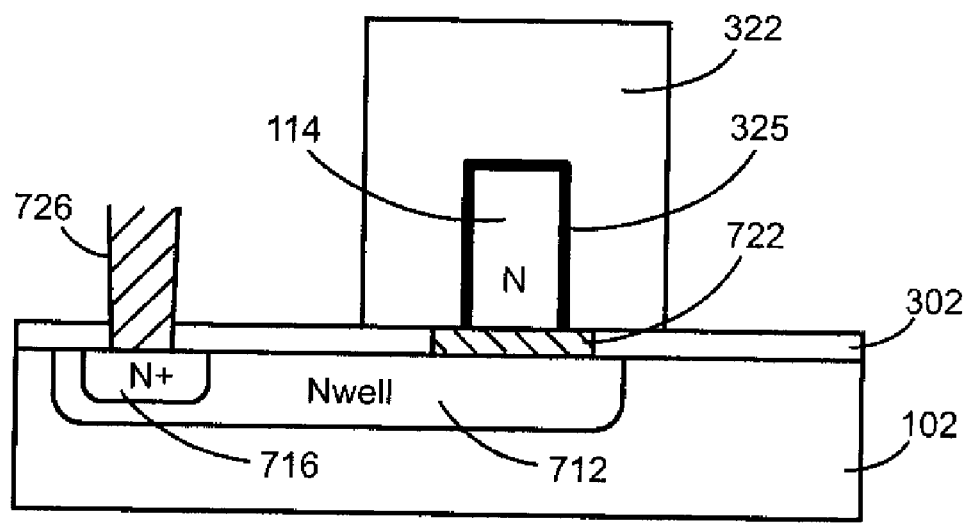
FIG. 7 is a cross-sectional view of the thin-body bipolar device at the base region illustrating a base contact made through the insulation layer and the substrate.

FIG. 7 is a cross-sectional view of the thin-body bipolar device 100 at the base region 114 illustrating a base contact made through the insulation layer 302 and the substrate 102. An Nwell 712 is formed in the substrate 102 along with an N+ region 716 for the Nwell pickup. The insulation layer 302 is grown on top of the substrate 102. A hole 722 in the insulation layer 302 is etched before the thin-fin-device is made. The hole 722 is placed at the location of the subsequent base region 114 of the thin-body bipolar device 100 and filled up with the same material as the base region 114 when the thin fin 110 is formed. On the Nwell pickup location, a contact opening 726 is etched and filled all the way through the insulation layer 302. Therefore, the connection to the base region 114 comprises the through-insulation-layer contact 726, the N+ region 716, the Nwell 712, and the hole 722 which is merged with the base region 114.

Although only connection to the N type base region 114 is illustrated in both FIGS. 6 and 7, one having skills in the art would apply the same principle to form a connection to a P type base region, in which case, a Pwell and a P+ pick-up, in place of the Nwell and N+ pick-up, respectively, will be disposed. Although either Nwell or Pwell are used to provide the through-substrate connection, one having skilled in the art would appreciate that other structures, such as active regions can be used in place or in junction of the Nwell or Pwell.

Figure 8:
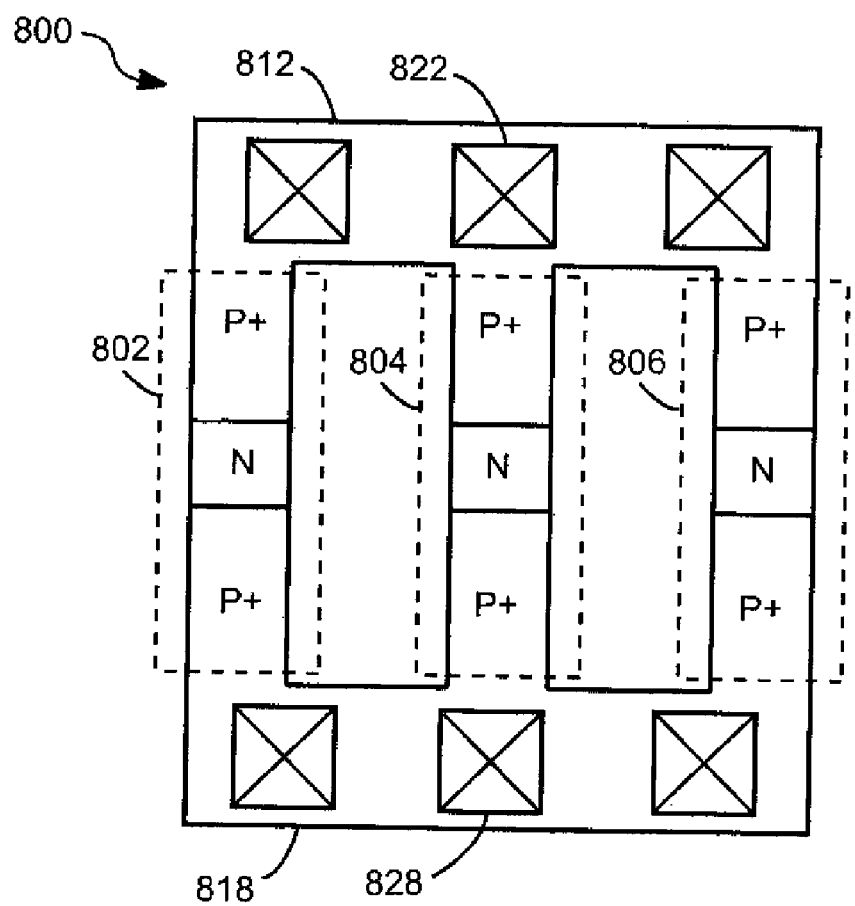
FIG. 8 is a two-dimensional layout view of a multi-fingered thin-body bipolar device.

FIG. 8 is a two-dimensional layout view of a multi-fingered thin-body bipolar device 800. Finger sections 802, 804 and 806 are thin-body bipolar devices formed according to the embodiment of the present invention as illustrated in FIG. 2 through FIG. 7. The thin fins that form the sections 802, 804 and 806 are extended to a common section 812 on the top and a common section 818 at the bottom. A plurality of contacts 822 are landed on the thin fin section 812 to serve as a collector connection. A plurality of contacts 828 are landed on the thin fin section 818 to serve as an emitter connection. Apparently the multi-fingered thin-body bipolar device 800 provides a compact layout when large device size is desired.

The above embodiment of the present invention proposes various structures of bipolar devices based on the FinFETs. As the structure designs of the FinFETs for ICs are scaled under 45 nm, the proposed thin-body bipolar devices are suitable in IC designs and compatible with the FinFET manufacturing process. The proposed thin-body bipolar devices are particularly suitable in radio frequency (RF) applications, analog circuits, and memory chips.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:
1. A thin-body bipolar device comprising:
a semiconductor substrate;

a semiconductor fin constructed over the semiconductor substrate;

a first region of the semiconductor fin having a first conductivity type, the first region serving as a base of the thin-body bipolar device; and a second and third region of the semiconductor fin having a second conductivity type opposite to the first conductivity type, the second and third region being both juxtaposed with and separated by the first region, the second and third region serving as an emitter and collector of the thin-body bipolar device, respectively, and wherein the first region is surrounded by a poly-silicon layer on both side walls of the semiconductor fin with an oxide layer separating the first region and the poly-silicon layer.

2. The thin-body bipolar device of claim 1 further comprising an insulation layer interposed between the semiconductor fin and the semiconductor substrate.

3. The thin-body bipolar device of claim 1, wherein the poly-silicon layer further covers the top of the first region with the oxide layer separating the first region and the poly-silicon layer.

4. The thin-body bipolar device of claim 1, wherein the substrate comprises a material selected from the group consisting of silicon (Si), germanium (Ge), gallium phosphide (GaP), indium arsenide (InAs), indium phosphide (InP), silicon germanium (SiGe), galkium arsenide (GaAs).

5. The thin-body bipolar device of claim 1, wherein a base contact is formed on top of the first region.

6. The thin-body bipolar device of claim 1, wherein a base connection is formed through the substrate.

7. The thin-body bipolar device of claim 2, wherein a base connection is formed through both the insulation layer and the substrate.

8. The thin-body bipolar device of claim 1, wherein the first conductivity type is an N type and the second conductivity type is a P type.

9. The thin-body bipolar device of claim 1, wherein the first conductivity type is a P type and the second conductivity type is an N type.

10. A thin-body bipolar device comprising:
a semiconductor substrate;
an insulation layer formed over the semiconductor substrate;
a semiconductor fin constructed over the insulation layer;
a first region of the semiconductor fin having a first conductivity type, the first region serving as a base of the thin-body bipolar device; and
a second and third region of the semiconductor fin having a second conductivity type opposite to the first conductivity type, the second and third region being both juxtaposed with and separated by the first region, the second and third region serving as an emitter and collector of the thin-body bipolar device, respectively, and
wherein the first region is surrounded by a poly-silicon layer on both side walls of the semiconductor fin with an oxide layer separating the first region and the poly-silicon layer.

11. The thin-body bipolar device of claim 10, wherein the poly-silicon layer further covers the top of the first region with the oxide layer separating the first region and the poly-silicon layer.

12. The thin-body bipolar device of claim 10, wherein the substrate comprises a material selected from the group consisting of silicon (Si), germanium (Ge), gallium phosphide (GaP), indium arsenide (InAs), indium phosphide (LIP), silicon germanium (SiGe), galkium arsenide (GaAs).

13. The thin-body bipolar device of claim 10, wherein a base contact is formed on top of the first region.

14. The thin-body bipolar device of claim 10, wherein a base connection is formed through both the insulation layer and the substrate.

15. The thin-body bipolar device of claim 10, wherein the first conductivity type is an N type and the second conductivity type is a P type.

16. The thin-body bipolar device of claim 10, wherein the first conductivity type is a P type and the second conductivity type is an N type.

* * * * *